United States Patent
Hsiao et al.

(10) Patent No.: US 8,634,506 B2
(45) Date of Patent: Jan. 21, 2014

(54) FREQUENCY CALIBRATION CIRCUIT FOR AUTOMATICALLY CALIBRATING FREQUENCY AND METHOD THEREOF

(75) Inventors: Fu-Yuan Hsiao, Hsinchu (TW); Ke-Ning Pan, Hsinchu (TW)

(73) Assignee: Weltrend Semiconductor Inc., Science-Based Industrial Park, Hsinchu (TW)

( * ) Notice: Subject to any disclaimer, the term of this patent is extended or adjusted under 35 U.S.C. 154(b) by 232 days.

(21) Appl. No.: 12/907,999

(22) Filed: Oct. 20, 2010

(65) Prior Publication Data

US 2012/0002764 A1    Jan. 5, 2012

Related U.S. Application Data

(60) Provisional application No. 61/359,829, filed on Jun. 30, 2010.

(51) Int. Cl.
    *H04L 27/06*    (2006.01)

(52) U.S. Cl.
    USPC ........... 375/344; 375/226; 375/354; 375/365; 375/366; 375/368; 375/371; 375/374; 455/75; 455/119; 455/173.1; 455/182.1; 455/182.2; 455/192.1; 455/192.2; 455/502; 455/516; 370/503; 370/508; 370/509; 370/510; 327/141; 327/163

(58) Field of Classification Search
    USPC ......... 375/354, 295, 226, 344, 365, 366, 368, 375/371, 374; 455/454, 434, 464, 63.3, 62, 455/75, 119, 173.1, 182.1, 182.2, 192.1, 455/192.2, 502, 516; 327/141, 163; 370/503, 508, 509, 510
    See application file for complete search history.

(56) References Cited

U.S. PATENT DOCUMENTS

| 7,315,216 | B2 | 1/2008 | Yang | |
|---|---|---|---|---|
| 2003/0227334 | A1 | 12/2003 | Chuang | |
| 2006/0021491 | A1* | 2/2006 | Greco et al. | 84/293 |
| 2010/0313059 | A1* | 12/2010 | Wang et al. | 713/502 |

FOREIGN PATENT DOCUMENTS

| TW | 200822567 | 5/2008 |
|---|---|---|
| TW | 200947184 | 11/2009 |
| TW | I328930 | 8/2010 |

* cited by examiner

*Primary Examiner* — Leon Flores
(74) *Attorney, Agent, or Firm* — Winston Hsu; Scott Margo

(57) ABSTRACT

Generate a series of digital data according to a pair of differential signals received from a low speed universal serial bus. Calibrate coarsely a frequency of an oscillator according to a width of an end-of-packet of the series of digital data. And calibrate finely the frequency of the oscillator according to a width of a SYNC pattern of the series of digital data.

14 Claims, 6 Drawing Sheets

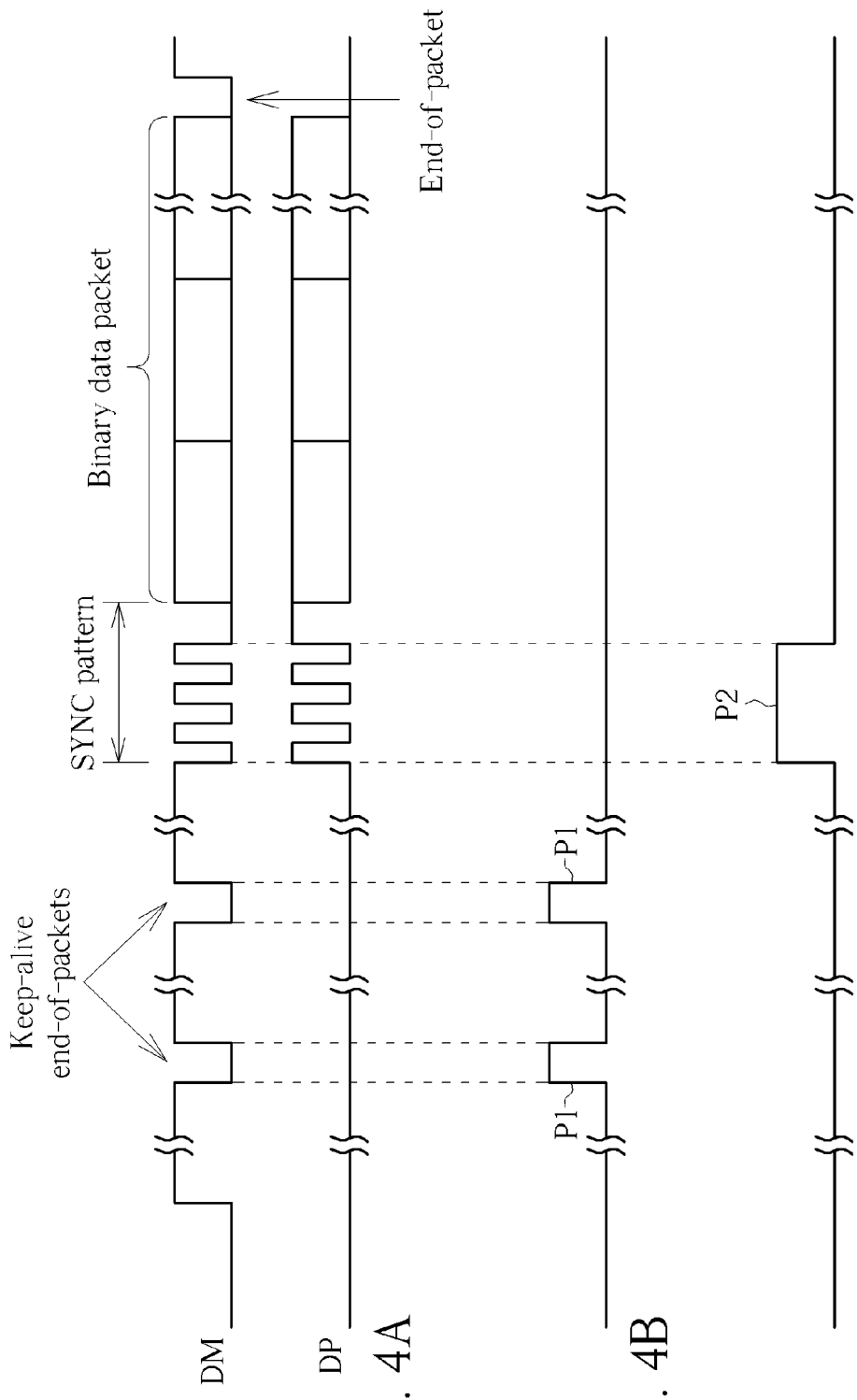

FREQUENCY CALIBRATION CIRCUIT FOR AUTOMATICALLY CALIBRATING FREQUENCY AND METHOD THEREOF

CROSS REFERENCE TO RELATED APPLICATIONS

This application claims the benefit of U.S. Provisional Application No. 61/359,829, filed on Jun. 30, 2010 and entitled "FREQUENCY CALIBRATION CIRCUIT FOR AUTOMATICALLY CALIBRATING FREQUENCY AND METHOD THEREOF," the contents of which are incorporated herein by reference.

BACKGROUND OF THE INVENTION

1. Field of the Invention

The present invention is related to a frequency calibration circuit for automatically calibrating frequency and method thereof, and particularly to a frequency calibration circuit for automatically calibrating frequency according to an end-of-packet and a SYNC pattern of a low-speed Universal Serial Bus and method thereof.

2. Description of the Prior Art

An oscillator is one component found in many electronic products. Periodic waves generated by oscillators may be employed as carriers in communication systems, as timers or counters in computers or control systems, and as signals with different clocks used to control other circuits in microprocessors.

Generally speaking, frequencies generated by crystal oscillators, such as quartz oscillators, are more accurate, but system vendors often use less accurate non-crystal oscillators, such as resistor-capacitor (RC) oscillators, due to lower cost. The prior art uses corrected parameters to program non-volatile memories, such as an erasable programmable read only memory (EPROM), an electrically-erasable programmable read-only memory (EEPROM), and a flash memory, during production of the non-volatile memories, or uses laser-trimming to calibrate the frequency of the RC oscillator. However, regardless of whether the corrected parameters are written to the non-volatile memory or the laser-trimming is employed, additional cost is incurred.

SUMMARY OF THE INVENTION

An embodiment of the present invention provides a method for automatically calibrating frequency. The method includes generating a series of digital data according to a pair of differential signals received from a low-speed Universal Serial Bus (USB); outputting a first pulse and a first predetermined value when an end-of-packet (EOP) is detected from the series of digital data; counting a first number of clocks generated by an oscillator during the first pulse; comparing the first number of clocks with the first predetermined value to generate a first comparison result; calibrating coarsely a frequency of the oscillator according to the first comparison result; outputting a second pulse and a second predetermined value when a SYNC pattern is detected; counting and accumulating a second number of clocks generated by the oscillator during the second pulse; counting number of the second pulses; stopping counting and accumulating the second number of clocks when the number of the second pulses is equal to a predetermined value; comparing the accumulated second number of clocks with the second predetermined value to generate a second comparison result; calibrating finely the frequency of the oscillator according to the second comparison result; and clearing the number of the second pulses.

Another embodiment of the present invention provides a frequency calibration circuit for automatically calibrating frequency. The frequency calibration circuit includes a Universal Serial Bus, a physical layer, a pulse generator, an oscillator, a first counter, a comparator, and a controller. The Universal Serial Bus is used for transmitting a pair of differential signals from a host in a low-speed mode. The physical layer is coupled to the Universal Serial Bus for converting the pair of differential signals into a series of digital data, wherein the series of digital data comprises a plurality of binary data packets, idle data, and a plurality of keep-alive end-of-packets. The pulse generator is coupled to the physical layer for determining to output a first pulse corresponding to an end-of-packet or a second pulse corresponding to a SYNC pattern and determining to output a first predetermined value corresponding to the end-of-packet or a second predetermined value corresponding to the SYNC pattern according to an adjusting signal when detecting the end-of-packet or the SYNC pattern from the series of digital data. The oscillator is used for generating clocks. The first counter is coupled to the pulse generator and the oscillator for counting first number of clocks generated by the oscillator during the first pulse and counting second number of clocks generated by the oscillator during the second pulse. The comparator is coupled to the first counter and the pulse generator for comparing the first number of clocks with the first predetermined value to generate a first comparison result, and comparing the accumulating second number of clocks with the second predetermined value to generate a second comparison result. The controller is coupled to the comparator, the oscillator, and the pulse generator for generating the adjusting signal according to the second pulse, and calibrating the clocks generated by the oscillator according to the first comparison result and the second comparison result.

The present invention provides a frequency calibration circuit for automatically calibrating frequency and method thereof. The frequency calibration circuit for automatically calibrating frequency and method thereof utilize an end-of-packet of a low-speed Universal Serial Bus to calibrate coarsely a frequency of an oscillator, and a SYNC pattern of the low-speed Universal Serial Bus to calibrate finely the frequency of the oscillator. Thus, the present invention may be applied to electronic products without using the non-volatile memory and/or the laser trimming to greatly simplify process of manufacturing and testing chips.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4A is a diagram illustrating the host sending the pair of differential signals after the host connects to the Universal Serial Bus.

FIG. 4B is a diagram illustrating the first pulse generator generating the first pulse according to the end-of-packet.

FIG. 4C is a diagram illustrating the second pulse generator generating the second pulse according to the SYNC pattern.

DETAILED DESCRIPTION

Figure 1:
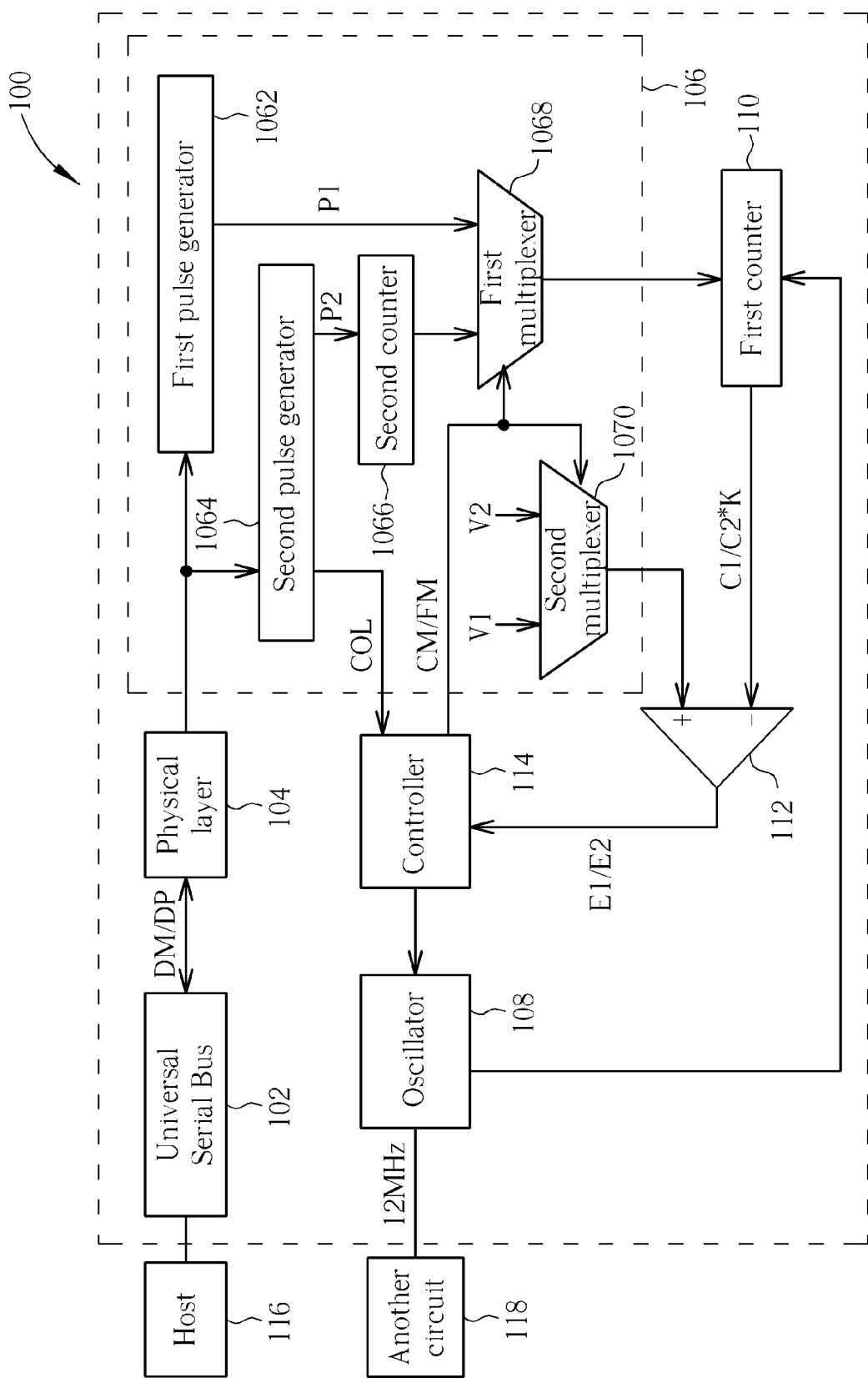
FIG. 1 is a diagram illustrating a frequency calibration circuit using an end-of-packet and a SYNC pattern of a low-speed Universal Serial Bus to calibrate frequency of a resistor-capacitor oscillator automatically according to an embodiment of the present invention.

Please refer to FIG. 1. FIG. 1 is a diagram illustrating a frequency calibration circuit 100 using an end-of-packet (EOP) and a SYNC pattern of a low-speed Universal Serial Bus to calibrate frequency of a resistor-capacitor (RC) oscillator automatically according to an embodiment of the present invention. The frequency calibration circuit 100 includes a Universal Serial Bus 102, a physical layer 104, a pulse generator 106, an oscillator 108, a first counter 110, a comparator 112, and a controller 114. The Universal Serial Bus 102 is used for transmitting a pair of differential signals DM/DP from a host 116 in a low-speed mode. The physical layer (PHY) 104 is coupled to the Universal Serial Bus 102 for converting the pair of differential signals into a series of digital data, where the series of digital data includes a plurality of binary data packets, idle data, and a plurality of keep-alive end-of-packets (EOPs). The pulse generator 106 is coupled to the physical layer 104 for determining to output a first pulse P1 corresponding to the end-of-packet or a second pulse P2 corresponding to the SYNC pattern and determining to output a first predetermined value V1 corresponding to the end-of-packet or a second predetermined value V2 corresponding to the SYNC pattern according to an adjusting signal generated by the controller 114 when detecting the end-of-packet or the SYNC pattern from the series of digital data. The oscillator 108 is used for generating a 12 MHz reference frequency for another circuit 118 of a circuit system, where the oscillator 108 is a resistor-capacitor oscillator (RC oscillator). The frequency of the oscillator 108 is not limited to 12 MHz, and the oscillator 108 can also generate another frequency different from 12 MHz. The first counter 110 is coupled to the pulse generator 106 and the oscillator 108 for counting a first number of clocks C1 generated by the oscillator 108 during the first pulse P1 and counting a second number of clocks C2 generated by the oscillator 108 during the second pulse P2. The comparator 112 is coupled to the first counter 110 and the pulse generator 106 for comparing the first number of clocks C1 with the first predetermined value V1 to generate a first comparison result E1, and comparing the accumulating second number of clocks C2*K with the second predetermined value V2 to generate a second comparison result E2, where a predetermined value K can be changed according to a user's request and the predetermined value K is a positive integer greater than or equal to 4. The controller 114 is coupled to the comparator 112, the oscillator 108, and the pulse generator 106 for generating the adjusting signal according to the second pulse P2, and calibrating the frequency of the oscillator 108 according to the first comparison result E1 and the second comparison result E2, where the adjusting signal includes a coarse tune mode CM and a fine tune mode FM.

The pulse generator 106 includes a first pulse generator 1062, a second pulse generator 1064, a second counter 1066, a first multiplexer 1068, and a second multiplexer 1070. The first pulse generator 1062 is coupled to the physical layer 104 for generating the first pulse P1. The second pulse generator 1064 is coupled to the physical layer 104 for generating the second pulse P2, and a control signal COL for the controller 114. The second counter 1066 is coupled to the second pulse generator 1064 for counting a number of the second pulses. The second counter 1066 stops counting and clearing the number of the second pulses when the number of the second pulses is equal to the predetermined value K. The first multiplexer 1068 is coupled to the first pulse generator 1062, the second counter 1066 and the controller 114 for determining to output the first pulse P1 or the second pulse P2 to the first counter 110 according to the coarse tune mode CM or the fine tune mode FM.

Figure 2:
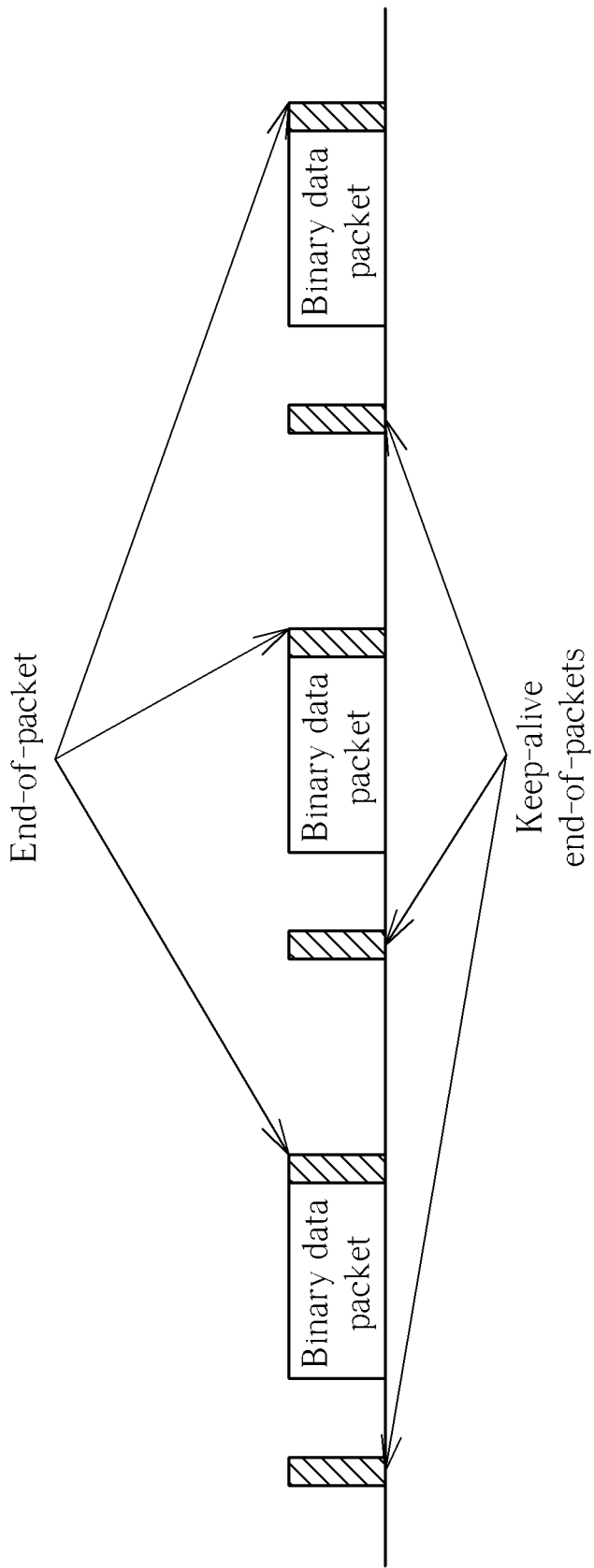
FIG. 2 is a diagram illustrating the end-of-packets including an end-of-packet appearing after each binary data packet and the keep-alive end-of-packets generated by the host.
Figure 3:
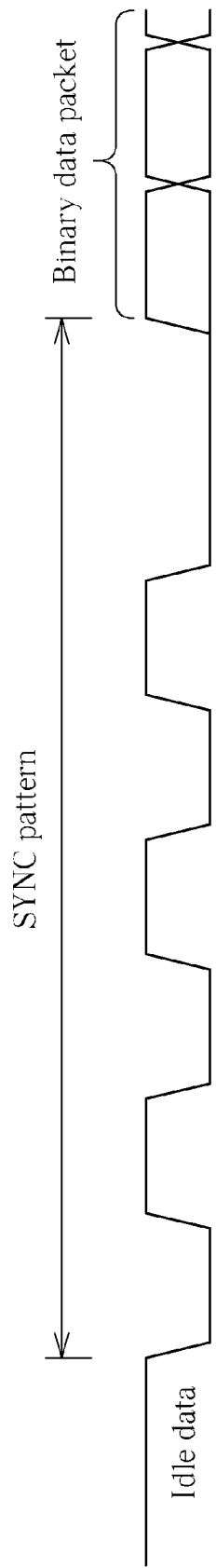
FIG. 3 is a diagram illustrating a SYNC pattern of the low-speed Universal Serial Bus or a full speed Universal Serial Bus.

Please refer to FIG. 2. FIG. 2 is a diagram illustrating the end-of-packets including an end-of-packet appearing after each binary data packet and the keep-alive end-of-packets generated by the host 116. A USB specification version 2.0, section 7.1.13.2.1 defines width of the end-of-packet of the low-speed Universal Serial Bus as between 1.25 µs and 1.50 µs, which the user can utilize the width of the end-of-packet of the low-speed Universal Serial Bus to calibrate coarsely the frequency of the oscillator 108. Please refer to FIG. 3. FIG. 3 is a diagram illustrating a SYNC pattern of the low-speed Universal Serial Bus or a full speed Universal Serial Bus. As shown in FIG. 3, the Universal USB specification version 2.0, section 7.1.10 defines the SYNC pattern of the low-speed Universal Serial Bus or the full speed Universal Serial Bus as 01010100, where the SYNC pattern appears before each binary data packet.

Please refer to FIG. 4A, FIG. 4B, and FIG. 4C. FIG. 4A is a diagram illustrating the host 116 sending the pair of differential signals DM/DP after the host 116 connects to the Universal Serial Bus 102, FIG. 4B is a diagram illustrating the first pulse generator 1062 generating the first pulse P1 according to the end-of-packet, and FIG. 4C is a diagram illustrating the second pulse generator 1064 generating the second pulse P2 according to the SYNC pattern. Initially, the host 116 only sends a plurality of keep alive end-of-packets to the Universal Serial Bus 102. As shown in FIG. 4B, the first pulse generator 1062 generates the first pulse P1 according to the width of the end-of-packet when the pulse generator 106 detects the end-of-packet. After a period of time, the host 116 starts to output the SYNC pattern. As shown in FIG. 4C, because the USB specification version 2.0, section 7.1.11 defines a data rate of the low-speed Universal Serial Bus as 1.50 Mb/s±1.5% (15,000 ppm), the user can utilize the data rate to calibrate finely the frequency of the oscillator 108 according to the predetermined value K times a width of 010101 in the SYNC pattern.

Figure 5A:
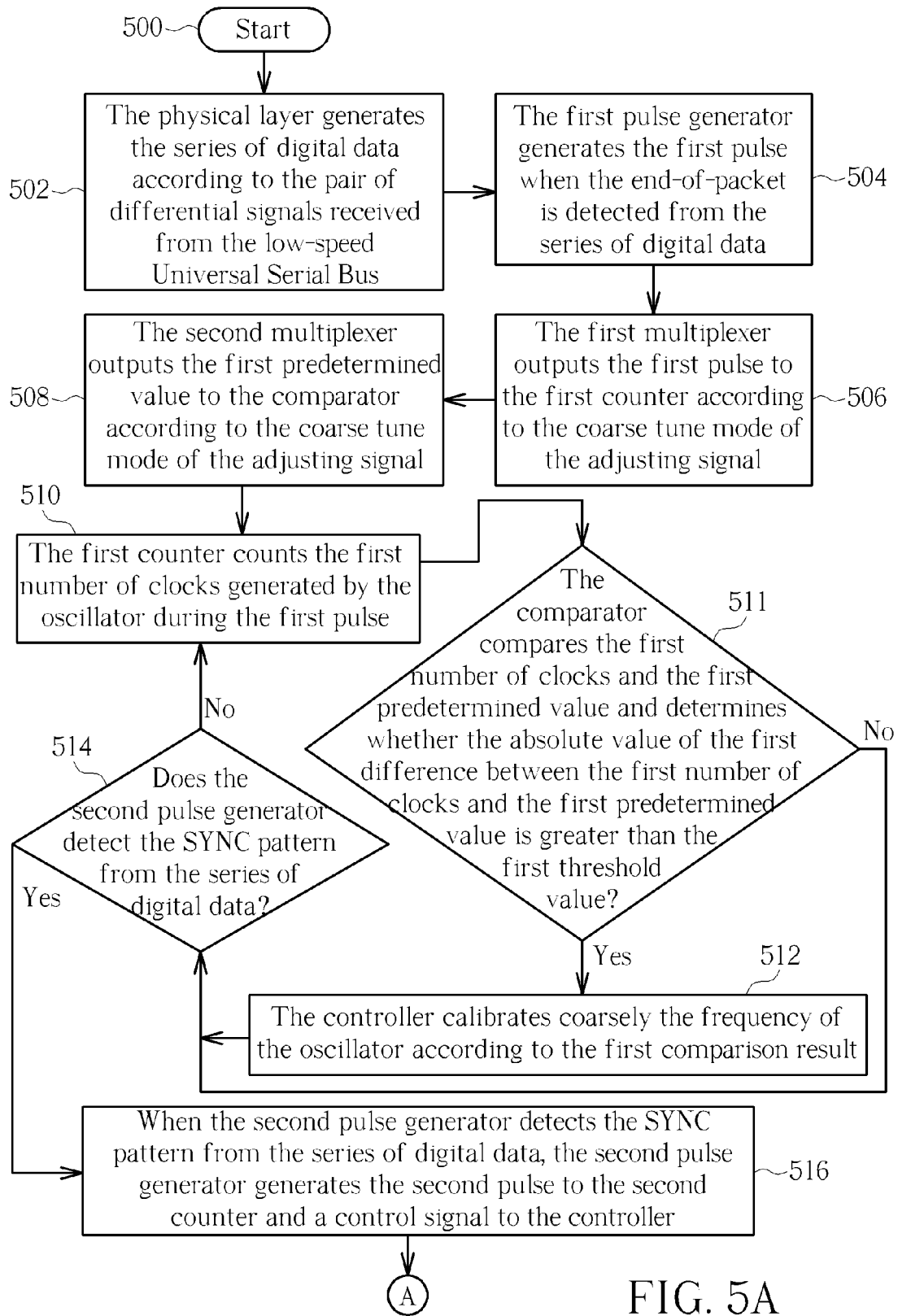
FIG. 5A and FIG. 5B are flowcharts illustrating a method that uses an end-of-packet and a SYNC pattern of a low-speed Universal Serial Bus to calibrate frequency of an RC oscillator automatically according to another embodiment of the present invention.
Figure 5B:
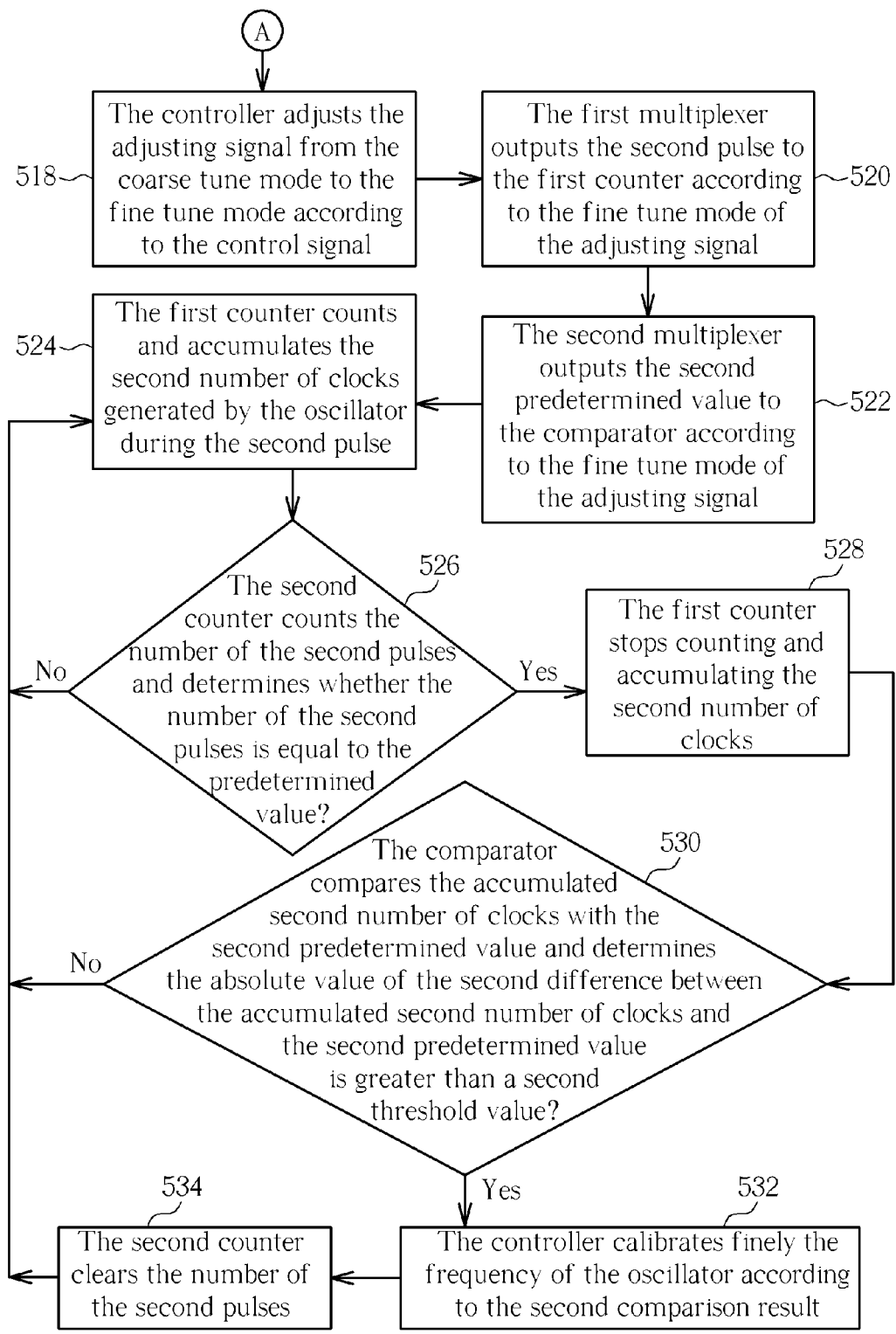

Please refer to FIG. 5A and FIG. 5B. FIG. 5A and FIG. 5B are flowcharts illustrating a method that uses an end-of-packet and a SYNC pattern of a low-speed Universal Serial Bus to calibrate frequency of an RC oscillator automatically according to another embodiment of the present invention. The method in FIG. 5A and FIG. 5B is illustrated with the frequency calibration circuit 100 in FIG. 1. Detailed steps are as follows:

Step 500: Start.

Step 502: The physical layer 104 generates the series of digital data according to the pair of differential signals received from the low-speed Universal Serial Bus 102.

Step 504: The first pulse generator 1062 generates the first pulse P1 when the end-of-packet is detected from the series of digital data.

Step 506: The first multiplexer 1068 outputs the first pulse P1 to the first counter 110 according to the coarse tune mode CM of the adjusting signal.

Step 508: The second multiplexer 1070 outputs the first predetermined value V1 to the comparator 112 according to the coarse tune mode CM of the adjusting signal.

Step 510: The first counter 110 counts the first number of clocks C1 generated by the oscillator 108 during the first pulse P1.

Step 511: The comparator 112 compares the first number of clocks C1 and the first predetermined value V1; if the absolute value of the first difference between the first number of clocks C1 and the first predetermined value V1 is greater than the first threshold value T1, the comparator 112 generates the first comparison result E1 and proceeds to Step 512; if not, go to Step 514.

Step 512: The controller 114 calibrates coarsely the frequency of the oscillator 108 according to the first comparison result E1.

Step 514: Does the second pulse generator 1064 detect the SYNC pattern from the series of digital data? If yes, go to Step 516; if no, go to Step 510.

Step 516: When the second pulse generator 1064 detects the SYNC pattern from the series of digital data, the second pulse generator 1064 generates the second pulse P2 to the second counter 1066 and a control signal COL to the controller 114.

Step 518: The controller 114 adjusts the adjusting signal from the coarse tune mode CM to the fine tune mode FM according to the control signal COL.

Step 520: The first multiplexer 1068 outputs the second pulse P2 to the first counter 110 according to the fine tune mode FM of the adjusting signal.

Step 522: The second multiplexer 1070 outputs the second predetermined value V2 to the comparator 112 according to the fine tune mode FM of the adjusting signal.

Step 524: The first counter 110 counts and accumulates the second number of clocks C2 generated by the oscillator 108 during the second pulse P2.

Step 526: The second counter 1066 counts the number of the second pulses and determines whether the number of the second pulses is equal to the predetermined value K; if yes, go to Step 528; if no, go to Step 524.

Step 528: The first counter 110 stops counting and accumulating the second number of clocks.

Step 530: The comparator 112 compares the accumulated second number of clocks C2*K with the second predetermined value V2; if the absolute value of the second difference between the accumulated second number of clocks C2*K and the second predetermined value V2 is greater than a second threshold value T2, the comparator 112 generates the second comparison result E2 and proceeds to Step 532; if not, go to Step 524.

Step 532 The controller 114 calibrates finely the frequency of the oscillator 108 according to the second comparison result E2.

Step 534: The second counter 1066 clears the number of the second pulses; go to Step 524.

In Step 504, as shown in FIG. 4B, the first pulse generator 1062 generates the first pulse P1 according to the width of the end-of-packet when the end-of-packet is detected from the series of digital data by the first pulse generator 1062. The adjusting signal generated by the controller 114 is the coarse tune mode CM before the controller 114 receives the control signal COL generated by the second pulse generator 1064. In Step 506, the first multiplexer 1068 outputs the first pulse P1 to the first counter 110 according to the coarse tune mode CM of the adjusting signal. In Step 508, the second multiplexer 1070 outputs the first predetermined value V1 to the comparator 112 according to the coarse tune mode CM of the adjusting signal. Because the width of the end-of-packet of the low-speed Universal Serial Bus is between 1.25 µs and 1.50 µs, the first predetermined value V1 is set to be 16, that is to say, the frequency of the oscillator 108 (12 MHz) divided by 0.75 MHz (1.33 µs). But the frequency of the oscillator 108 is not limited to 12 MHz. The first predetermined value V1 is changed with the frequency of the oscillator 108. For example, if the frequency of the oscillator 108 is 15 MHz, the first predetermined value V1 is set to be 20 (15 MHz/0.75 MHz=20). In Step 510, the first counter 110 counts the first number of clocks C1 generated by the oscillator 108 during the first pulse P1. In Step 511, when the absolute value of the first difference between the first number of clocks C1 and the first predetermined value V1 is greater than the first threshold value T1, the comparator 112 generates the first comparison result E1. When the absolute value of the first difference between the first number of clocks C1 and the first predetermined value V1 is less than the first threshold value T1, go to Step 514. In Step 512, the controller 114 calibrates coarsely the frequency of the oscillator 108 according to the first comparison result E1 until the second pulse generator 1064 detects the SYNC pattern from the series of digital data. The width of the end-of-packet of the low-speed Universal Serial Bus is between 1.25 µs and 1.50 µs, so the frequency of the oscillator 108 is only calibrated coarsely by the width of the end-of-packet. In addition, as shown in the method of FIG. 5A and FIG. 5B, the first counter 110, the comparator 112, the controller 114, the first multiplexer 1068, the second multiplexer 1070, and the oscillator 108 form a loop for automatically calibrating coarsely the frequency of the oscillator 108. Therefore, the frequency of the RC oscillator 108 may be limited to near 12 MHz through the loop when the frequency of the RC oscillator 108 shifts.

In Step 516, when the second pulse generator 1064 detects the SYNC pattern from the series of digital data, the second pulse generator 1064 generates the second pulse P2 to the second counter 1066 and a control signal COL to the controller 114, where the second counter 1066 starts to count the number of the second pulses. In Step 518, the controller 114 adjusts the adjusting signal from the coarse tune mode CM to the fine tune mode FM according to the control signal COL. In Step 524, the first counter 110 counts and accumulates the second number of clocks C2 generated by the oscillator 108 during the second pulse P2. That is to say, when the number of the second pulses is not yet equal to the predetermined value K, the first counter 110 keeps on counting and accumulating the second number of clocks C2, and does not send the second number of clocks C2 to the comparator 112 temporarily, where the predetermined value K is set by the user. As shown in FIG. 4A, because a width of a 3KJ pair of the SYNC pattern is 3 times the width of the end-of-packet, the second predetermined value V2 is 3*K times the first predetermined value V1 (16*3*K=48*K). But the frequency of the oscillator 108 is not limited to 12 MHz. The second predetermined value V2 is changed with the frequency of the oscillator 108. For example, if the frequency of the oscillator 108 is 15 MHz, the second predetermined value V2 is set to be 60*K. In Step 528, when the number of the second pulses counted by the counter 1066 is equal to the predetermined value K, the first counter 110 stops counting and accumulating the second number of clocks C2. In Step 530, the comparator 112 compares the accumulated second number of clocks C2*K with the second predetermined value V2. When the absolute value of the second difference between the accumulated second number of clocks C2*K and the second predetermined value V2 is greater than the second threshold value T2, the comparator 112 generates the second comparison result E2. When the absolute value of the second difference between the accumulated second number of clocks C2*K and the second predetermined value V2 is less than the second threshold value T2, go to Step 524. In addition, the USB specification version 2.0, section 7.1.11 defines a data rate of the low-speed Universal Serial Bus as 1.50 Mb/s±1.5% (15,000 ppm), which the user can utilize the data rate of the low-speed Universal Serial Bus to calibrate finely the second threshold value T2 according to the data rate of the low-speed Universal Serial Bus. In Step 532, the controller 114 calibrates finely the frequency of the oscillator 108 according to the second comparison result E2. In Step 534, the second counter 1066 clears the number of the second pulses, and proceeds to Step 524. Further, as shown in the method of FIG. 5A and FIG. 5B, the second counter 1066, the first counter 110, the comparator 112, the controller 114, the first multiplexer 1068, the second multiplexer 1070, and the oscillator 108 form a loop for automatically calibrating finely the frequency of the oscillator 108.

To sum up, the frequency calibration circuit for automatically calibrating frequency and method thereof utilize the end-of-packet of the low-speed Universal Serial Bus to calibrate coarsely the frequency of the oscillator, and the SYNC pattern of the low-speed Universal Serial Bus to calibrate finely the frequency of the oscillator. Thus, the present invention may be applied to electronic products without using the non-volatile memory and/or the laser trimming to greatly simplify processes of manufacturing and testing chips.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for automatically calibrating frequency, the method comprising:
generating a series of digital data according to a pair of differential signals received from a low-speed Universal Serial Bus (USB);
outputting a first pulse and a first predetermined value according to a keep-alive end-of-packet (EOP) of a plurality of keep-alive end-of-packets when the keep-alive end-of-packet is detected at a beginning of the series of digital data, wherein width of the first pulse is equal to width of the keep-alive end-of-packet;
counting a first number of clocks generated by an oscillator during the first pulse;
comparing the first number of clocks with the first predetermined value to generate a first comparison result;
calibrating coarsely a frequency of the oscillator according to the first comparison result;
outputting a second pulse and a second predetermined value according to a SYNC pattern when the SYNC pattern is detected from the series of digital data after the first pulse is generated, wherein width of the second pulse is shorter than width of the SYNC pattern;
counting and accumulating a second number of clocks generated by the oscillator during the second pulse;
counting a number of the second pulse;
stopping counting and accumulating the second number of clocks when the number of the second pulse is equal to K, wherein K is a positive integer and larger than 2;
comparing an accumulated second number of clocks with the second predetermined value to generate a second comparison result, wherein the accumulated second number of clocks is equal to K multiple of the second number of clocks generated by the oscillator during the second pulse;
calibrating finely the frequency of the oscillator according to the second comparison result; and
clearing the number of the second pulses.

2. The method of claim 1, wherein outputting the first pulse and the first predetermined value according to the keep-alive end-of-packet of the plurality of keep-alive end-of-packets when the end-of-packet is detected comprises:
outputting the first pulse and the first predetermined value according to a coarse tune mode of an adjusting signal.

3. The method of claim 2, wherein outputting the first pulse and the first predetermined value according to the coarse tune mode of the adjusting signal comprises:
a first multiplexer outputting the first pulse according to the coarse tune mode of the adjusting signal; and
a second multiplexer outputting the first predetermined value according to the coarse tune mode of the adjusting signal.

4. The method of claim 2, wherein a controller adjusts the adjusting signal from the coarse tune mode to the fine tune mode according to a control signal generated by a second pulse generator according to the SYNC pattern.

5. The method of claim 1, wherein comparing the first number of clocks with the first predetermined value to generate the first comparison result is generating the first comparison result when an absolute value of a first difference between the first number of clocks and the first predetermined value is greater than a first threshold value.

6. The method of claim 1, wherein outputting the second pulse and the second predetermined value according to the SYNC pattern when the SYNC pattern is detected comprises:
outputting the second pulse and the second predetermined value according to a fine tune mode of the adjusting signal.

7. The method of claim 6, wherein outputting the second pulse and the second predetermined value according to the fine tune mode of the adjusting signal comprises:
the first multiplexer outputting the second pulse according to the fine tune mode of the adjusting signal; and
the second multiplexer outputting the second predetermined value according to the fine tune mode of the adjusting signal.

8. The method of claim 7, wherein a controller adjusts the adjusting signal from the coarse tune mode to the fine tune mode according to a control signal generated by a second pulse generator according to the SYNC pattern.

9. The method of claim 1, wherein comparing the accumulated second number of clocks with the second predetermined value to generate the second comparison result is generating the second comparison result when an absolute value of a second difference between the accumulated second number of clocks and the second predetermined value is greater than a second threshold value.

10. A frequency calibration circuit for automatically calibrating frequency, the frequency calibration circuit comprising:
a Universal Serial Bus for transmitting a pair of differential signals from a host in a low-speed mode;
a physical layer (PHY) coupled to the Universal Serial Bus for converting the pair of differential signals into a series of digital data, wherein the series of digital data comprises a plurality of binary data packets, idle data, and a plurality of keep-alive end-of-packets;
a pulse generator coupled to the physical layer for determining to output a first pulse according to a keep-alive end-of-packet of the plurality of keep-alive end-of-packets when the keep-alive end-of-packet is detected at a beginning of the series of digital data or a second pulse according to a SYNC pattern when the SYNC pattern is detected from the series of digital data after the first pulse is generated, and determining to output a first predetermined value corresponding to the keep-alive end-of-packet when detecting the keep-alive end-of-packet from the series of digital data or a second predetermined value corresponding to the SYNC pattern according to an adjusting signal when detecting the SYNC pattern from the series of digital data, wherein width of the first pulse is equal to width of the keep-alive end-of-packet and width of the second pulse is shorter than width of the SYNC pattern;

an oscillator for generating clocks;

a first counter coupled to the pulse generator and the oscillator for counting a first number of clocks generated by the oscillator during the first pulse and counting a second number of clocks generated by the oscillator during the second pulse;

a comparator coupled to the first counter and the pulse generator for comparing the first number of clocks with the first predetermined value to generate a first comparison result, and comparing the accumulating second number of clocks with the second predetermined value to generate a second comparison result; and a controller coupled to the comparator, the oscillator, and the pulse generator for generating the adjusting signal according to the second pulse, and calibrating the clocks generated by the oscillator according to the first comparison result and the second comparison result.

11. The frequency calibration circuit of claim 10, wherein the adjusting signal comprises a coarse tune mode and a fine tune mode.

12. The frequency calibration circuit of claim 11, wherein the pulse generator comprises:

a first pulse generator coupled to the physical layer for generating the first pulse;

a second pulse generator coupled to the physical layer for generating the second pulse;

a second counter coupled to the second pulse generator for counting a number of the second pulse;

a first multiplexer coupled to the first pulse generator, the second counter and the controller for determining to output the first pulse or the second pulse to the first counter according to the coarse tune mode or the fine tune mode; and a second multiplexer coupled to the controller and the comparator for determining to output the first predetermined value or the second predetermined value to the comparator according to the coarse tune mode or the fine tune mode.

13. The frequency calibration circuit of claim 10, wherein the pulse generator comprises:

a first pulse generator coupled to the physical layer for generating the first pulse;

a second pulse generator coupled to the physical layer for generating the second pulse;

a second counter coupled to the second pulse generator for counting a number of the second pulse;

a first multiplexer coupled to the first pulse generator, the second counter and the controller for determining to output the first pulse or the second pulse to the first counter according to the coarse tune mode or the fine tune mode; and a second multiplexer coupled to the controller and the comparator for determining to output the first predetermined value or the second predetermined value to the comparator according to the coarse tune mode or the fine tune mode.

14. The frequency calibration circuit of claim 10, wherein the oscillator is a resistor-capacitor oscillator (RC oscillator).

* * * * *